(12) United States Patent
Burcovich et al.

(10) Patent No.: US 11,650,243 B2
(45) Date of Patent: May 16, 2023

(54) AUTOMOBILE LIGHTING UNIT WITH OLED LIGHT SOURCES AND RELATED OPERATING METHOD

(71) Applicant: Marelli Automotive Lighting Italy S.p.A., Venaria Reale (IT)

(72) Inventors: Carlotta Burcovich, Tolmezzo (IT); Giulio Manfreda, Tolmezzo (IT); Sara Padovani, Tolmezzo (IT)

(73) Assignee: Marelli Automotive Lighting Italy S.p.A., Venaria Reale (IT)

( * ) Notice: Subject to any disclaimer, the term of this patent is extended or adjusted under 35 U.S.C. 154(b) by 0 days.

(21) Appl. No.: 16/832,070

(22) Filed: Mar. 27, 2020

(65) Prior Publication Data
US 2020/0309844 A1    Oct. 1, 2020

(30) Foreign Application Priority Data
Mar. 29, 2019  (EP) .................... 19166378

(51) Int. Cl.
*G01R 31/26* (2020.01)
*B60Q 1/02* (2006.01)

(52) U.S. Cl.
CPC .......... *G01R 31/2635* (2013.01); *B60Q 1/02* (2013.01)

(58) Field of Classification Search
CPC .... G01R 31/00; G01R 31/2635; G01R 31/26; G01R 31/28; G01R 31/282; G01R 31/2632; G01R 31/2633; G01R 11/25; G01R 22/068; G01R 31/52; G01R 31/007; B60Q 1/02
See application file for complete search history.

(56) References Cited

U.S. PATENT DOCUMENTS

| | | | |
|---|---|---|---|
| 9,603,210 B1* | 3/2017 | Carlen | H05B 45/39 |
| 2009/0322800 A1* | 12/2009 | Atkins | G09G 3/3413 |
| | | | 345/690 |
| 2017/0048935 A1* | 2/2017 | Koo | H05B 45/37 |
| 2018/0213617 A1 | 7/2018 | Regau | |

FOREIGN PATENT DOCUMENTS

| | | |
|---|---|---|
| FR | 3049064 A1 | 9/2017 |
| KR | 2006 113000 A | 11/2006 |

OTHER PUBLICATIONS

European Search Report dated Sep. 26, 2019 for European Patent Application 19166378.0.

\* cited by examiner

*Primary Examiner* — Son T Le
(74) *Attorney, Agent, or Firm* — McCarter & English, LLP

(57) ABSTRACT

An automobile lighting unit is provided that includes a lighting device provided with one or more OLED light sources, and an electronic device configured in such a way as to control an OLED light source by means of a pilot signal which has a trailing edge wherein the pilot signal varies between a high value and a low value, to determine an electrical quantity indicative of the electrical behaviour of the OLED light source in a measurement time interval (toff) following the trailing edge of said pilot signal, and to determine a failure condition of the OLED light source on the basis of an electrical quantity.

12 Claims, 7 Drawing Sheets

AUTOMOBILE LIGHTING UNIT WITH OLED LIGHT SOURCES AND RELATED OPERATING METHOD

CROSS-REFERENCE TO RELATED APPLICATIONS

This patent application claims priority from European patent application no. 19166378.0 filed on Mar. 29, 2019, the entire disclosure of which is incorporated herein by reference.

TECHNICAL FIELD

The present invention relates to an automobile lighting unit provided with OLED (Organic Light Emitting Diode) light sources, an OLED electronic lighting device preferably installable in an automobile lighting unit, and an operating method for the automobile lighting unit.

In greater detail, the present invention relates to a lighting unit which can be installed in an automobile or a motor vehicle or any similar motorised vehicle, of the type that comprises preferably, but not necessarily: a casing structured in such a way as to be able to be recessed into a bay formed in the vehicle's bodywork; a front lenticular body made at least partially of transparent or semi-transparent material that can be coupled to the casing at its mouth, and an electronic OLED lighting device which is designed to be housed inside the casing.

BACKGROUND OF THE INVENTION

The use of OLED light sources in the latest generation of automobile lighting units is known. OLED light sources make it easy to obtain homogeneous illuminating surfaces with which to dynamically produce new graphic effects and localised light geometries, so as to achieve multiple lighting functions using the same lighting unit.

However, in the case of the above-mentioned automobile lighting units with OLED light sources, there is still the requirement to be able to determine/detect a failure/breakage condition of the OLED light sources.

SUMMARY OF THE INVENTION

The object of this invention is therefore to produce an automobile lighting unit which meets this requirement.

This objective is achieved by the present invention in that it relates to an automobile lighting unit comprising a lighting device provided with one or more OLED light sources, and electronic means configured to: control an OLED light source by means of a pilot signal which has a trailing edge wherein the pilot signal varies between a high value and a low value, to determine an electrical quantity indicative of the electrical behaviour of said OLED light source in a measurement time interval following said trailing edge of said pilot signal, and to determine a failure condition of said OLED light source on the basis of said electrical quantity.

Preferably, the pilot signal is a voltage signal comprising at least a square/rectangular waveform; said electrical quantity indicative of the electrical behaviour of the OLED light source is the voltage of the OLED light source.

Preferably, the pilot signal (P1) comprises a PWM signal, said measurement time interval following said trailing edge is the OFF time interval of said PWM signal, said electrical quantity comprising the voltage (VS) measured across said OLED light source during said OFF time interval of said PWM signal.

Preferably, the OLED light source comprises one or more light emitting areas; a failure condition is indicative of a dead area state in at least one of said light emitting areas.

Preferably, the OLED light source has a multi-pixel light emitting OLED structure comprising a plurality of light emitting areas, each of which is associated with a pixel.

Preferably, the OLED light source has a segmented OLED light emitting structure comprising a plurality of light emitting areas each of which is associated with an OLED segment.

Preferably, the PWM pilot signal has a frequency between about 100 hertz and about 500 hertz, preferably about 200 hertz.

Preferably, the electronic means are configured to determine said failure condition when the measured electrical quantity is below a predetermined threshold.

Preferably, the electronic means comprise an electronic measuring device designed to measure the voltage of the OLED light source during said measurement time interval, and an electronic processing device, which determines a failure condition indicative of the presence of said dead area state, based on said voltage and a reference voltage threshold.

Preferably, a failure condition of the OLED source indicating the presence of the dead area state in one or more OLED light emitting areas is determined when said voltage does not meet a predefined condition with said voltage threshold.

Preferably, said failure condition of the OLED light source indicating the presence of the dead area state in one or more OLED light emitting areas is determined when said voltage is lower than the voltage threshold.

Preferably, the electronic means are configured to: perform a number of voltage measurements during said measurement time interval, determine/construct the voltage curve during said measurement time interval on the basis of the measured voltages, determine the mean square error between the voltage curve measured during the measurement time interval and a reference voltage curve indicative of the voltage trend in a condition of absence of the dead area state in one or more OLED light emitting areas, and determine the presence of a failure condition indicative of the dead area state in one or more OLED light emitting areas on the basis of the mean square error.

Preferably, the electronic means are configured to: characterise the trend of the voltage during said measurement time interval by means of a first exponential function $ys=as*e^{(-bsx)}+cs$, compare the coefficients as, bs, and cs of said first exponential function ys with the respective predefined coefficients a1, b1, and c1 of a second reference exponential function $yr=a1*e^{-b1x}+c1$, which characterises the voltage trend in the absence of a failure condition indicative of a dead area state, and determine the presence of the dead area state in one or more OLED light emitting areas on the basis of the result of said comparison.

Preferably, the electronic means are configured to: calculate, by means of an integration function/operation, a value indicative of the area under the curve of said voltage during said measurement time interval, compare the calculated value with a predetermined value and determine the presence of the dead area state in one or more OLED light emitting areas on the basis of the result of the comparison.

Preferably, said electronic means comprise an electronic control circuit and a diagnostic circuit; said electronic control circuit comprises a control stage, said diagnostic circuit comprises a subtraction stage, an integration stage, and a comparison stage.

Preferably, the control stage is designed to control the OLED light source by means of the pilot signal corresponding to a PWM signal.

Preferably, the control stage comprises: an OLED light source control branch provided with an electronic switch, and a resistor connected in series between a first terminal of the OLED light source and a terminal placed at a reference voltage, a generator which provides the output pilot signal characterised by pulses during first time intervals and absence of pulses during second time intervals corresponding to said measurement time intervals, an operational amplifier provided with a non-inverting terminal receiving the pilot signal, and an inverting terminal connected between the resistor and the transistor, and an output terminal connected to the control terminal of the transistor.

Preferably, the subtraction stage is connected between the first terminal of the OLED light source and a second terminal of the OLED light source which is in turn connected to a supply voltage.

Preferably, the subtraction stage is configured to supply the output voltage measured across the OLED light source during the measurement time interval, in response to the pilot signal.

Preferably, the integration stage is connected at the output of the subtraction stage and is configured to receive the measured voltage and integrate it over the measurement time interval so as to determine and output a value indicative of the electrical behaviour of the OLED light source during the time interval.

Preferably, the comparison stage is connected with the output of the integration stage to receive the value indicative of the electrical behaviour of the OLED light source during the time interval, and is configured to compare this value with a predetermined threshold value, and to supply an output signal which is indicative of the presence or alternatively of the absence of a failure condition resulting from the presence or respectively absence of a dead area state in one or more OLED light emitting areas of the OLED light source, on the basis of the outcome of the comparison.

The present invention further relates to an operating method of an electronic lighting device of a lighting unit provided with at least one OLED light source; the method comprises the steps of: controlling said OLED light source by means of a pilot signal which has a trailing edge wherein the pilot signal varies between a high value and a low value, determining an electrical quantity indicative of the electrical behaviour of said OLED light source in a measurement time interval following said trailing edge of said pilot signal, and determining a failure condition of said OLED light source on the basis of said electrical quantity.

Preferably, the pilot signal is a voltage signal comprising at least a square/rectangular waveform; said electrical quantity indicative of the electrical behaviour of the OLED light source is the voltage of the OLED light source.

Preferably, the pilot signal comprises a PWM signal, said time interval following said trailing edge is the OFF time interval of said PWM signal, said electrical quantity comprising the voltage measured across said OLED light source during said OFF time interval of said PWM signal.

Preferably, the OLED light source comprises one or more light emitting areas, said failure condition being indicative of a dead area state in at least one of said light emitting areas.

Preferably, the OLED light source has a multi-pixel OLED light emitting structure.

Preferably, the OLED light source has a segmented OLED light emitting structure.

Preferably, in the method, said PWM signal has a frequency between about 100 hertz and about 500 hertz, preferably about 200 hertz.

Preferably, a failure condition of the OLED source indicating the presence of the dead area state in one or more OLED light emitting areas is determined when said voltage does not meet a predefined condition with said voltage threshold.

Preferably, a failure condition of the OLED source indicating the presence of the dead area state in one or more OLED light emitting areas is determined when said voltage is lower than the voltage threshold.

Preferably, the method comprises the steps of: performing a number of voltage measurements during said time interval, determining/constructing the voltage curve during said measurement time interval on the basis of the measured voltages, determining the mean square error between the voltage curve measured during the measurement time interval and a reference voltage curve indicative of the voltage trend in a condition of absence of the dead area state in one or more OLED light emitting areas, and determining the presence of a failure condition indicative of the dead area state in one or more OLED light emitting areas based on the mean square error.

Preferably, the method preferably comprises the steps of: characterising the trend of the voltage during said measurement time interval by means of a first exponential function $ys=as*e^{(-bsx)}+cs$, comparing the coefficients as, bs, and cs of said first exponential function ys with the respective predefined coefficients a1, b1, and c1 of a second reference exponential function $yr=a1*e^{-b1x}+c1$ which characterises the voltage trend in a condition of absence of the dead area state, and determining the presence of the dead area state in one or more OLED light emitting areas based on result of said comparison.

Preferably, the method comprises the steps of: calculating, by means of an integration function/operation, a value indicative of the area under the curve of said voltage during said measurement time interval, comparing the calculated value with a predetermined value and determining the presence of the dead area state in one or more OLED light emitting areas on the basis of the result of the comparison.

The present invention is further related to a vehicle lighting device provided with one or more OLED light sources, characterised in that it comprises electronic means configured to: control said OLED light source by means of a pilot signal which has a trailing edge wherein the pilot signal varies between a high value and a low value, determine an electrical quantity indicative of the electrical behaviour of said OLED light source in a measurement time interval following said trailing edge of said pilot signal, and determine a failure condition of said OLED light source based on said electrical quantity.

Preferably, said pilot signal generated by the electronic means of the lighting device is a voltage signal comprising at least a square/rectangular waveform; said electrical quantity indicative of the electrical behaviour of the OLED light source is the voltage of the OLED light source.

Preferably, the pilot signal generated by the electronic means of the lighting device comprises a PWM signal.

Preferably, the measurement time interval following said trailing edge of the pilot signal generated by the electronic means of the lighting device is the OFF time interval of said PWM signal.

Preferably, the electrical quantity comprises the voltage measured across said OLED light source during said OFF time interval of said PWM signal generated by the electronic means of the lighting device.

Preferably, the lighting device is provided with an OLED light source which comprises one or more light emitting areas; a failure condition is indicative of a dead area state in at least one of said light emitting areas.

Preferably, the OLED light source of the lighting device has a multi-pixel OLED light emitting module.

Preferably, the OLED light source of the lighting device has a segmented OLED light emitting module.

Preferably, the PWM pilot signal generated by the electronic means of the lighting device has a frequency between about 100 hertz and about 500 hertz, preferably about 200 hertz.

Preferably, the electronic means of the lighting device are configured to determine a failure condition when the measured electrical quantity is lower than a predetermined threshold.

Preferably, the electronic means of the lighting device comprise an electronic measuring device which are designed to measure the voltage of the OLED light source during said measurement time interval, and an electronic processing device which determines a failure condition indicative of the presence of said dead area state, based on said voltage and a reference voltage threshold.

Preferably, a failure condition of the OLED source indicating the presence of the dead area state in one or more OLED light emitting areas is determined by the electronic means of the lighting device when said voltage does not meet a predefined condition with said voltage threshold.

Preferably, a failure condition of the OLED source indicating the presence of the dead area state in one or more OLED light emitting areas is determined by the electronic means of the lighting device when said voltage is lower than the voltage threshold.

Preferably, the lighting device comprises electronic means configured to: performs a number of voltage measurements during said measurement time interval, determine/construct the voltage curve during said time interval on the basis of the measured voltages, determine the mean square error between the voltage curve measured during the time interval and a reference voltage curve indicative of the voltage trend in a condition of absence of the dead area state in one or more OLED light emitting areas, and determine the presence of a failure condition indicative of the dead area state in one or more OLED light emitting areas based on the mean square error.

Preferably, the lighting device comprises electronic means configured to: characterise the trend of the voltage during said measurement time interval by means of a first exponential function $ys = as^* e^{(-bsx)} + cs$, comparing the coefficients as, bs, and cs of said first exponential function ys with the respective predefined coefficients a1, b1, and c1 of a second reference exponential function $yr = a1^* e^{-b1x} + c1$ which characterises the voltage trend in a condition of absence of the dead area state, and determine the presence of the dead area state in one or more OLED light emitting areas on the basis of the result of said comparison.

Preferably, the lighting device comprises electronic means configured in such a way as to: calculate, by means of an integration function/operation, a value indicative of the area under the curve of said voltage during said measurement time interval, compare the calculated value with a predetermined value and determine the presence of the dead area state in one or more OLED light emitting areas on the basis of the result of the comparison.

Preferably, the lighting device is provided with electronic means which comprise an electronic control circuit and a diagnostic circuit; said electronic control circuit comprises a control stage, said diagnostic circuit comprises a subtraction stage, an integration stage, and a comparison stage.

BRIEF DESCRIPTION OF THE DRAWINGS

The present invention will now be described with reference to the accompanying drawings which illustrate a non-limiting example of an embodiment, wherein.

DETAILED DESCRIPTION OF THE INVENTION

The present invention will now be described in detail with reference to the attached figures so as to allow a skilled person to create and use it. Various modifications to the described embodiments will be readily apparent to skilled persons and the generic principles described may be applied to other embodiments and applications without departing from the protective scope of the present invention as defined in the attached claims. Therefore, the present invention should not be regarded as limited to the embodiments described and illustrated, it should instead be granted the widest scope consistent with the principles and characteristics described and claimed herein.

Figure 1:
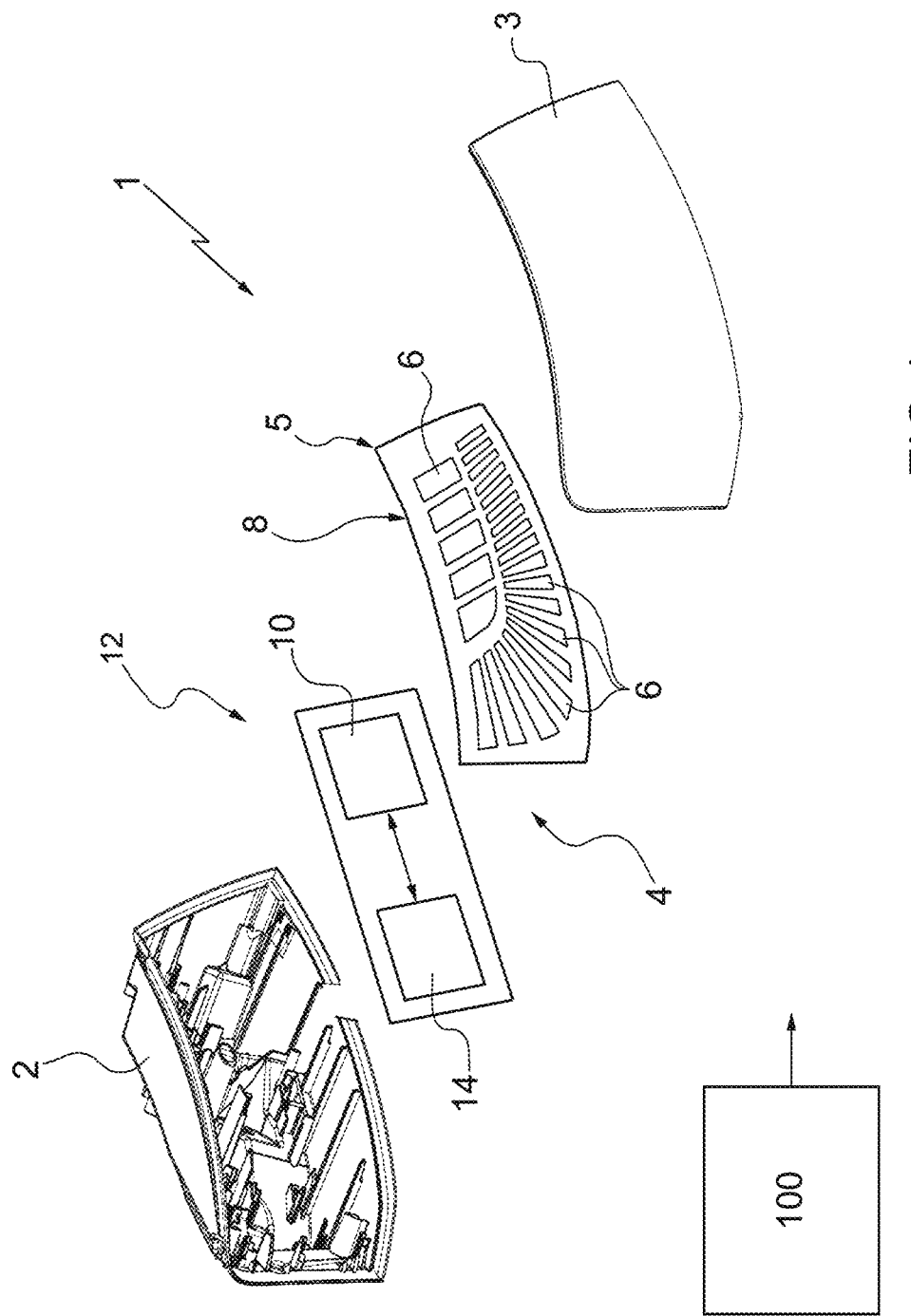
FIG. 1 is an exploded view of an example of an embodiment of an automobile lighting unit made according to the dictates of the present invention.

With reference to FIG. 1, the number 1 illustrates schematically in its entirety an exploded view of an automobile lighting unit made according to an example of an embodiment of the present invention.

The automobile lighting unit 1 may comprise, preferably but not necessarily: a shaped rear casing 2 which is preferably, but not necessarily, cup-shaped. The rear casing 2 may, for example, be structured in such a way that it can preferably, but not necessarily, be recessed, for example, into a bay in the vehicle's bodywork (not shown).

According to the example shown in FIG. 1, the automobile lighting unit 1 may further preferably comprise a front lenticular body 3 made, for example, at least partially of transparent or semi-transparent material. The front lenticular body 3 can be structured in such a way that it can be coupled to the rear casing 2. The front lenticular body 3 can preferably be arranged at the mouth of the rear casing 2 in such a way that it preferably emerges at least partially from the vehicle's bodywork (not shown).

According to the preferred embodiment shown in FIG. 1, the automobile lighting unit 1 further comprises a lighting device 4.

The lighting device 4 may comprise an OLED light emitting circuit 5. The OLED light emitting circuit 5 may comprise one or more OLED light sources 8, i.e. OLEDs, provided with one or more light emitting areas 6.

Figure 8:
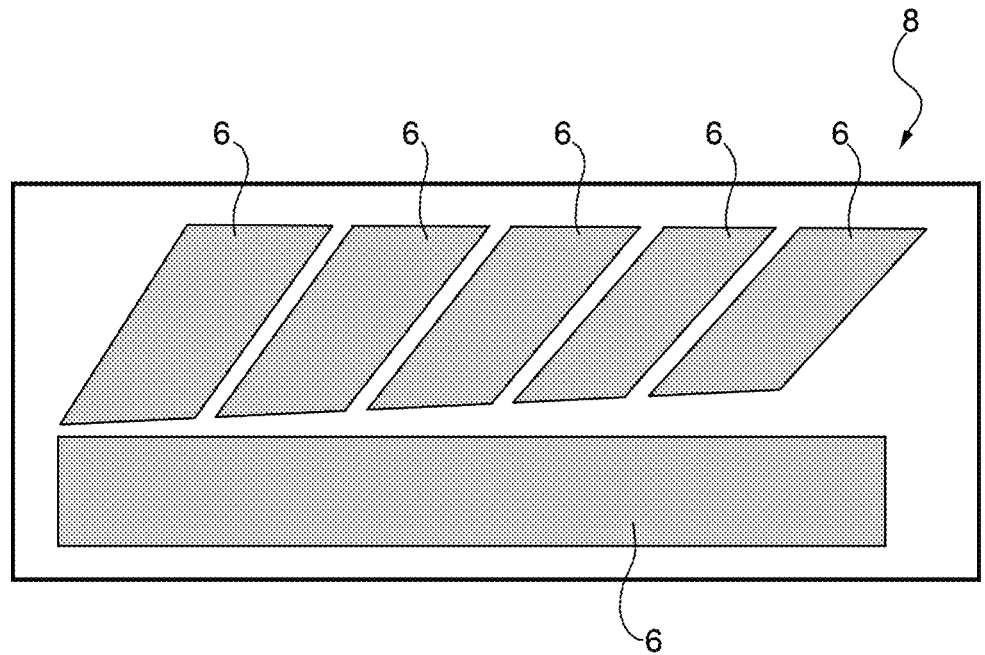
FIG. 8 schematically shows a series of light emitting areas of a segmented OLED light source in the switched-on state in the absence of a failure condition.
Figure 9:
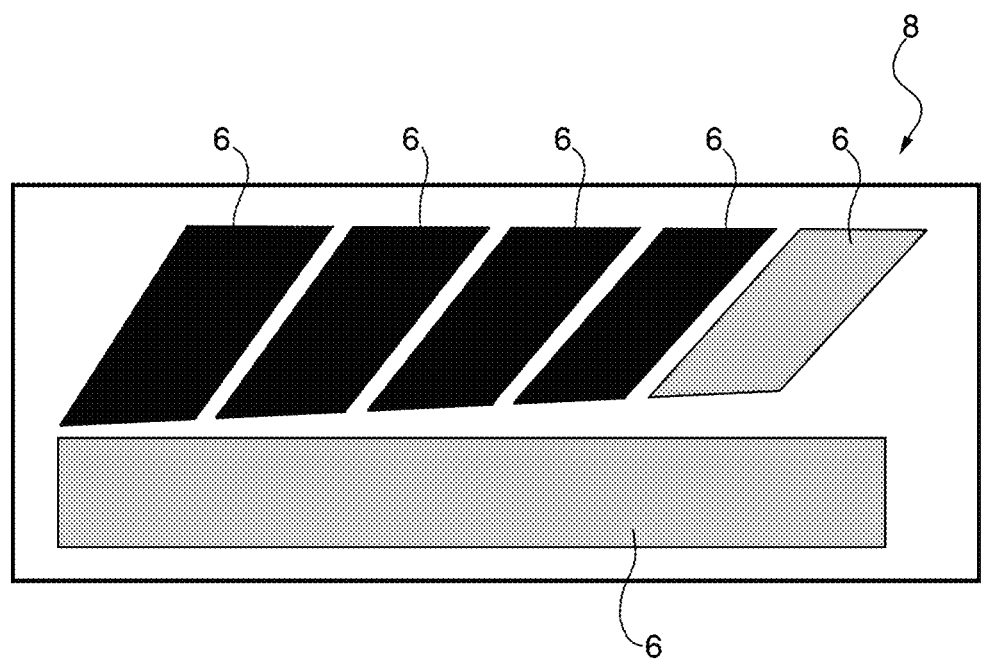
FIG. 9 schematically shows the light emitting areas shown in FIG. 8 in the presence of a failure condition in the four black areas on the left.

According to a possible embodiment shown in FIGS. 8 and 9, the light emitting areas 6 are comprised in at least one OLED light source 8, i.e. at least one OLED, which has a so-called "segmented" OLED light emitting module. Each OLED segment shown in FIGS. 8 and 9 corresponds to an OLED light emitting area 6. The "segmented" OLED light emitting module may have a circuit configuration having a single cathode (common cathode), and a plurality of independent anodes by means of which it is possible to selectively control a complete and uniform switched-on or switched-off state for each OLED segment, i.e. the entire OLED light emitting area 6. By way of example, in FIG. 9, the four OLED light emitting areas 6 shown in black are in a "dead area state" described in detail below. It should be noted that according to this embodiment, the OLED light emitting areas 6, i.e. the OLED segments, can have a size of the order of a few tens of centimetres.

Figure 10:
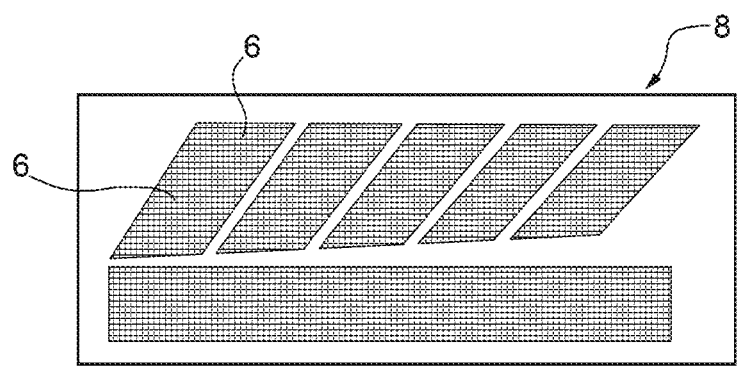
FIG. 10 schematically shows a series of light emitting areas of a multi-pixel OLED light source in the switched-on state in the absence of a failure condition.
Figure 11:
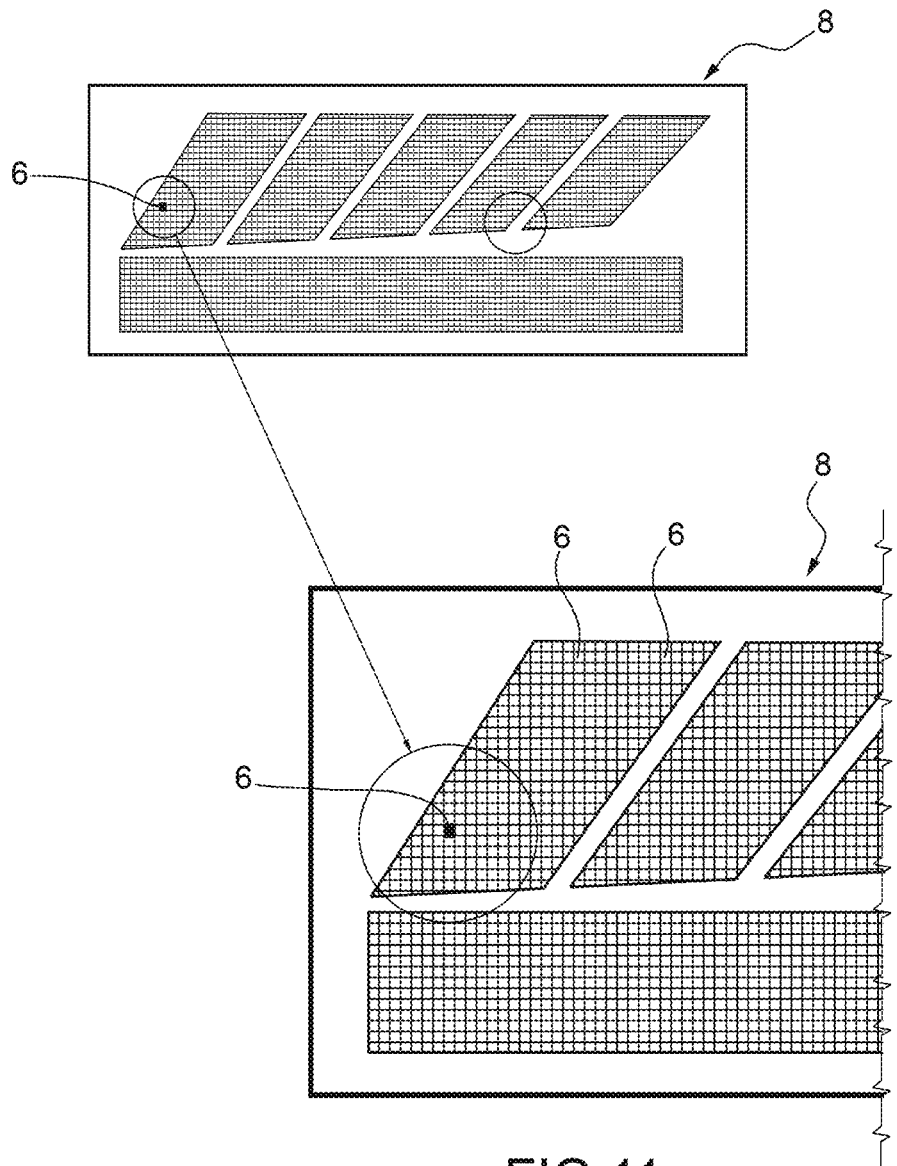
FIG. 11 schematically shows the light emitting areas shown in FIG. 10 in the presence of a failure condition in a black area, shown in enlarged scale, which represents an area the size of a pixel.

According to a different embodiment shown in FIGS. 10 and 11, the OLED light emitting areas 6 are comprised in at least one OLED light source 8, i.e. at least one OLED, which has a so-called "multi-pixel" OLED light emitting module, wherein each OLED light emitting area 6 is of a small size relative to the size of a "pixel" in a traditional OLED display (of the order of a few millimetres). By way of example, in FIG. 10 an OLED light emitting area 6, shown in black, having a reduced size corresponding to one pixel, is in a "dead area state" described in detail below.

It is understood that the present invention should not be considered limited to the "segmented" OLED light emitting modules and/or to the "multi-pixel" OLED light emitting modules described above and to which explicit reference will be made in the following discussion, but can be applied to any similar OLED lighting module such as, for example, an OLED module provided with a plurality of electrically independent OLEDs, i.e. comprising their respective anodes and cathodes.

In a failure condition, a light emitting area 6 of the OLED light source 8 can operate in either a switched-on (ON) state wherein the OLED light emitting area 6 of the OLED light source 8 emits light in response to a pilot signal, or in a switched-off (OFF) state wherein, in the absence of a pilot signal, the OLED light emitting area 6 of the OLED light source 8 does not emit light.

In a failure condition, the state of the light emitting area 6 of the OLED light source 8 may correspond to a "dead area state". In the dead area state, the OLED light emitting area 6 of the OLED light source 8 remains off, i.e. it does not emit light, even when it is supplied with a pilot signal (the anode receives a switch-on voltage).

In order to increase the clarity and understanding of the present invention, FIG. 8 shows for example a "segmented" OLED light source 8 wherein the six respective light emitting areas 6 are shown in grey to indicate a switched-on state, while FIG. 9 shows the same OLED light source 8 wherein four light emitting areas 6 are shown in black to indicate a dead area state.

In order to increase the clarity and understanding of the present invention, FIG. 10 shows instead an example of a "multi-pixel" OLED light source 8 wherein all the light emitting areas 6 are shown in grey to indicate a switched-on state, while FIG. 11 shows the same OLED light source 8 wherein one light emitting area 6 is shown in black to indicate a dead area state.

The lighting device 4 may further comprise an electronic device 12 configured so as to control the OLED light source(s) 8, selectively switching it/them between the switched-on and switched-off states.

According to the present invention, the electronic device 12 is further configured so as to determine a failure condition of the lighting device 4 when it detects the presence of a dead area state in one or more light emitting areas 6 of the OLED light sources 8.

Figure 2:
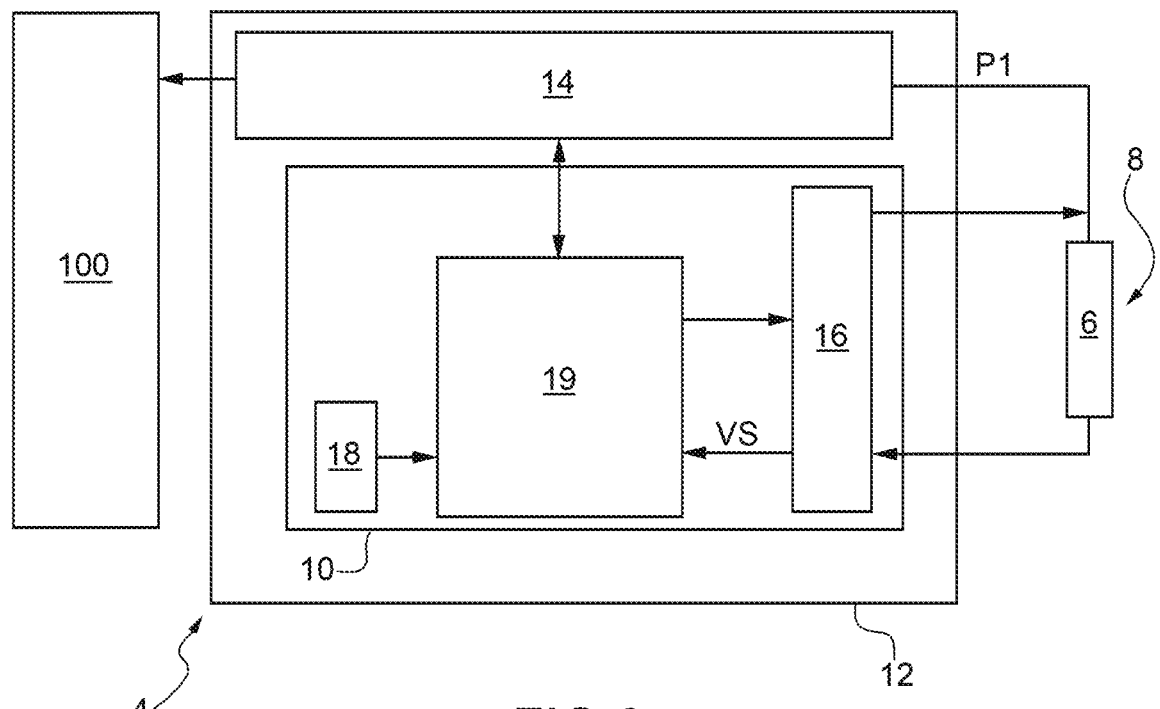
FIG. 2 is a block circuit diagram of an example of an embodiment of an electronic device of the automobile lighting unit shown in FIG. 1.

According to a possible embodiment shown in FIG. 2, the electronic device 12 may comprise, for example, an electronic control circuit 14 designed to selectively control the OLED light sources 8 and an electronic diagnostic circuit 10, which is designed to detect/determine the above failure condition of the light emitting area 6 of the OLED light source 8.

Preferably, but not necessarily, as shown in the example in FIG. 1, the control circuit 14 and the electronic diagnostic circuit 10 of the electronic device 12 may both be arranged in a single common PCB. However, it is understood that the control circuit 14 and the electronic diagnostic circuit 10 of the electronic device 12 can be arranged in separate respective electronic PCB boards, or in the same electronic board in which the OLED light emitting circuit 5 is mounted.

According to an example of a preferred embodiment shown in FIG. 1, the OLED light emitting circuit 5 could be conveniently placed in the automobile lighting unit 1 in such a way that it directly or indirectly faces the front lenticular body 3 to perform a lighting function and/or any vehicle light signalling function on the exterior of the vehicle (not shown).

It is understood that in the following description the term "automobile lighting unit" shall be understood as follows: a front light, a rear light, at least one external marker/position lamp, at least one direction indicator lamp (commonly indicated with an arrow), at least one brake light/stop lamp (commonly indicated by stop), at least one fog lamp, at least one reversing lamp, at least one dipped-beam lamp, at least one main-beam lamp, or any other type of lamp/light which can be installed in a similar motor vehicle, preferably a motor vehicle.

According to a preferred embodiment shown in FIG. 1, the lighting device 4 may preferably, but not necessarily, be housed inside the automobile lighting unit 1, for example in the rear casing 2.

However, it is understood that the present invention is not limited to the positioning of the electronic lighting device 4 inside the automobile lighting unit 1. In particular, the electronic lighting device 4 could be placed in and/or integrated into other parts of the vehicle. For example, the electronic lighting device 4 could be positioned on the rear window and/or in/on the vehicle's bodywork/chassis.

According to a preferred embodiment shown in FIG. 1, the OLED light sources 8 of the OLED light emitting circuit 5 can be controlled, being selectively switchable to the switched-on (ON) and switched-off (OFF) state, by the electronic control circuit 14 on the basis of one or more control signals supplied by a central control unit 100 (for example an electronic control unit) mounted in the vehicle. It is understood that the central control unit 100 may be comprised in the automobile lighting unit 1.

According to a preferred embodiment shown in FIG. 2, the electronic control circuit 14 can be configured to receive a signal from the electronic diagnostic circuit 10 indicating a failure condition caused by the presence of a dead area state in one or more light emitting areas 6 of the OLED light source 8.

The electronic control circuit 14 can further be configured to communicate with the central control unit 100 to provide it with signals indicating at least a failure condition indicative of the dead area state in one or more light emitting areas 6 of the OLED light source 8.

The electronic control circuit 14 can be connected to the central control unit 100 via at least one communication bus (not shown) to receive the control signals and can be provided in turn with control terminals to supply the pilot signals to selectively control one or more OLED light sources 8. The pilot signals generated by the electronic control circuit 14 can cause the OLED light sources 8 to be switched to either the switched-on (ON) state or the switched-off (OFF) state. It is understood that the pilot signals provided by the electronic control circuit 14 can also cause an adjustment to a controlling electrical quantity for the OLED light sources 8, for example a current or a voltage, so as to determine a corresponding modulation of and/or change in one or more of its lighting parameters, for example the light intensity and/or colour.

It is understood that other embodiments of the electronic device 12 are possible. For example, the electronic device 12 could comprise a static configuration register, not shown, which contains a predefined control/command configuration indicative of current values to be applied to the OLED sources 8. This register could in turn be contained in a memory installed in the same electronic board (not illustrated) which houses the control circuit 14.

As regards the electronic diagnostic circuit 10, it can be configured to communicate unidirectionally and/or bidirectionally with the electronic control circuit 14 and/or the central control unit 100. The central control unit 100 can be configured in such a way as to provide the above control signals on the basis of one or more data/electrical signals indicating a failure condition of the OLED light source 8 detected by the electronic device 12.

Figure 4:
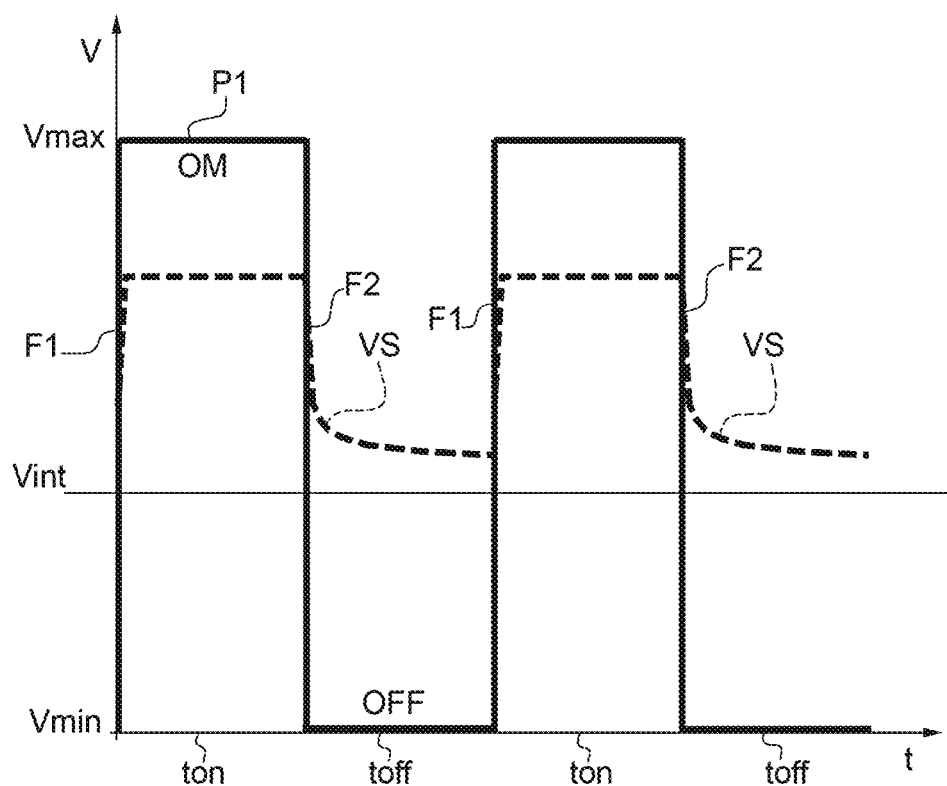
FIG. 4 is a graph showing the trend of the voltage across an OLED light source in response to its pilot signal in the absence of a failure condition.
Figure 5:
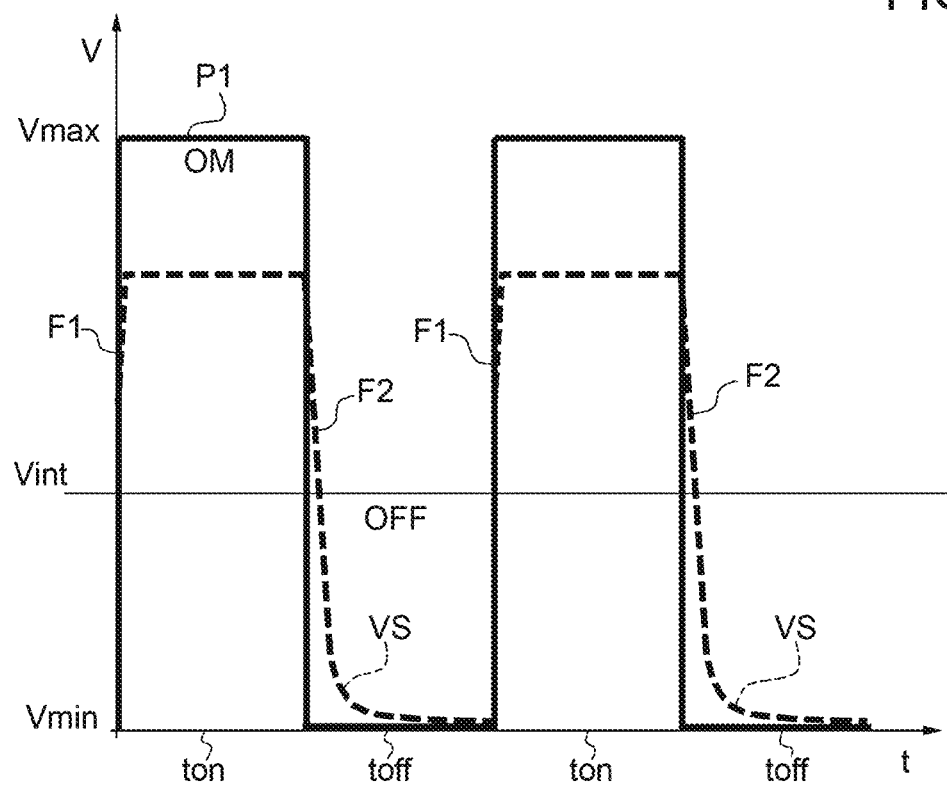
FIG. 5 is a graph showing the trend of the voltage across an OLED light source in response to its pilot signal in the presence of a failure condition.

According to an example of a preferred embodiment shown in FIGS. 2, 4 and 5, the electronic device 12 can be configured in such a way as to: control at least one OLED light source 8 by means of a pilot signal P1 which transits/varies between a high and a low value, determine an electrical quantity indicative of the electrical behaviour of the OLED light source 8 in a measurement time interval toff following the variation/transition of the pilot signal between the high and the low value, and determine a failure condition of the OLED light source 8 on the basis of the electrical quantity measured during the measurement time interval toff.

Preferably, the electronic device 12 can be configured to control the OLED light source 8 via the pilot signal P1, which corresponds to a square or rectangular waveform voltage signal shown in FIGS. 4 and 5. The voltage signal waveform may have: a minimum voltage Vmin corresponding to the above-mentioned low value, a maximum voltage Vmax corresponding to the above-mentioned high value, a leading edge F1 wherein the pilot signal P1 passes from the minimum voltage Vmin to the maximum voltage Vmax, and a trailing edge F2 wherein the pilot signal P1 passes from the maximum voltage Vmax to the minimum voltage Vmin.

Preferably, the electronic device 12 can be configured to measure and/or determine an electrical quantity corresponding to the voltage VS of the OLED light source 8 during the measurement time interval toff immediately following the trailing edge F2 of the pilot signal P1 and determine a failure condition associated with the dead area state in at least one light emitting area 6 of the OLED light source 8 on the basis of the measured/determined voltage VS.

The voltage Vmax preferably corresponds to a voltage value suitable to charge the capacitors of the equivalent circuit of the OLED (described below) during the transition of the OLED light source 8 into a switched-on state.

Preferably, the voltage Vmin can correspond to a voltage value which is suitable to at least partially discharge the capacitors of the equivalent circuit of the OLED.

A pilot signal P1 can preferably be supplied to the OLED light source 8 via an anode to transition a related light emitting area 6 of the OLED light source 8 to the switched-on state.

A particularly convenient pilot signal P1 with an approximately rectangular wave shape can be, for example, a PWM (Pulse Width Modulation) signal, which will be explicitly referred to in the following section without thereby losing any generality.

With reference to FIGS. 4 and 5, the pilot signal P1 of the PWM type preferably comprises positive pulses having the maximum voltage Vmax during the respective time intervals ton and the minimum voltage Vmin during the respective measurement time intervals toff.

The minimum voltage Vmin of the pilot signal P1 of the PWM type may preferably be about zero (Vmin about equal to 0 Volts) during the measurement time interval toff.

The Applicant has found that the voltage VS measured during the measurement time interval toff has a variation which depends on the transient discharge of the capacitors of the equivalent circuit of the OLED light source 8 and is indicative of the presence or absence of a failure condition of the OLED 8 light source.

In fact, the voltage VS measured during the measurement time interval toff depends on the presence of a failure/breakage of the OLED light source 8.

In greater detail, the voltage VS measured during the measurement time interval toff varies based on the presence/absence of a dead area state in one or more light emitting areas 6 of the OLED light source 8.

Figure 3:
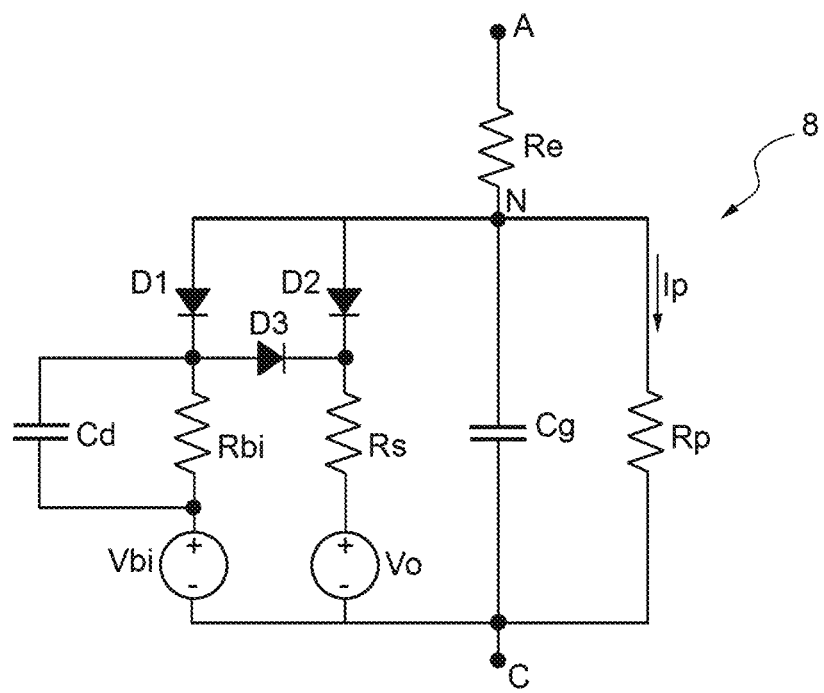
FIG. 3 shows an equivalent electrical circuit model of an OLED light source.

To increase the understanding and therefore the clarity of the present invention, reference is made to the equivalent electrical circuit model of an OLED light source 8 shown in FIG. 3.

This Model Comprises:

a resistor connected between the anode terminal A and a node N which has a resistance Re which is indicative of the resistance of a related OLED electrode;

a first electrical branch connected between the node A and the cathode terminal C, along which an ideal diode D1, a resistor having a built-in resistance Rbi, and a voltage generator Vbi representing the built-in voltage of the OLED light source 8 are connected in series;

a second electrical branch connected between the node N and the cathode terminal C, along which an ideal diode D2, a resistor with a resistance Rs, and a voltage generator Vo representing the threshold voltage of the OLED light source 8 necessary to have a substantial/significant conduction of current are connected in series;

an ideal diode D3 connected between the anodes of the two ideal diodes D1 and D2;

a capacitor connected in parallel to the resistor with resistance Rbi and having a diffusion capacitance Cd which represents the dependence of the OLED capacitance on the voltage, frequency and material of the cathode;

a capacitor with a geometric capacitance Cg associated with the form factor of the OLED; and a resistor with a leakage resistance Rp, which is connected in parallel to the geometric capacitance capacitor Cg and through which the leakage current Ip flows.

Laboratory tests carried out by the Applicant have shown that the voltage across an OLED light source 8 in response to a rising edge of the PWM signal pulse demonstrates a rapid transition from the minimum voltage Vmin to the maximum voltage Vmax. The speed of the transition depends essentially on the fact that the charging of the above-mentioned capacitors of the equivalent circuit of the OLED light source 8 occurs rapidly.

The tests also show that, following the falling edge of the pulse or the square wave of the pilot signal P1, there is a slow transition of the voltage VS across the OLED light source 8 from the maximum voltage Vmax to an intermediate voltage. In this case, the slowness of the variation in the voltage VS depends essentially on the transient discharge of the capacitors of the equivalent circuit of the OLED light source 8.

The Applicant has also found that when one or more light emitting areas 6 of the OLED light source 8 are in the "dead area state", a variation occurs, in particular a reduction in the intermediate voltage during the measurement time interval toff compared to the intermediate voltage measured in the same measurement time interval toff in the absence of the dead area state.

In other words, the Applicant has found that the voltage VS measured in a measurement time interval toff immediately following the trailing edge of a pulse or a square/rectangular wave of the pilot signal P1 supplied to an anode associated with a light emitting area 6 of an OLED light source 8 makes it possible to detect the presence of a failure condition of the OLED light source 8 caused by the presence of a dead area state in at least one of the light emitting areas 6.

Figure 7:
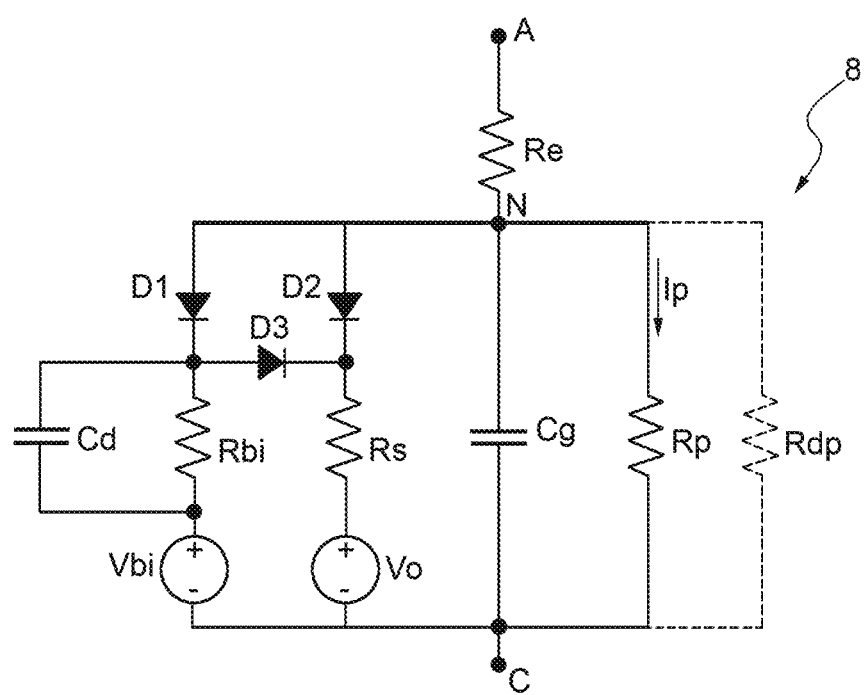
FIG. 7 shows an equivalent electrical circuit model of an OLED light source in a failure condition.

FIG. 7 shows an equivalent circuit model of an OLED light source 8 in a failure condition caused by the presence of a dead area state. It should be noted that the dead area state of an OLED light source 8 may be caused by damage to the cathode of the OLED light source 8. Such damage to the cathode can result in a short circuit between the anode and cathode of the OLED light source 8. In particular, such damage can be caused when the OLED is subjected to an overvoltage (for example, an electrostatic discharge) and/or when the OLED is exposed, during its operation, to low temperatures close to −40° C.

A failure condition of the OLED light source 8 is shown in the equivalent model in FIG. 7 which comprises a theoretical failure resistance Rdp connected in parallel to the leakage resistance Rp. The theoretical failure resistance Rdp has an extremely low value, substantially zero, and defines a short circuit condition between anode and cathode which occurs in the above failure condition.

FIG. 4 shows an example of a graph of the time trend of the voltage VS measured in response to a pilot signal P1 in a condition of correct operation of the OLED light source 8 where the voltage VS is greater than the intermediate voltage Vint.

FIG. 5 shows an example of a graph of the time trend of the voltage VS measured in response to the pilot signal P1 in a failure condition caused by a dead area state in a light emitting area 6 of the OLED light source 8 where the voltage VS is lower than the intermediate voltage Vint.

With reference to a possible example of an embodiment shown in FIG. 2, the electronic diagnostic circuit 10 may comprise: an electronic measuring device 16 designed to measure the voltage VS of the OLED light source 8 during the measurement time interval toff; preferably, but not necessarily, a memory device 18 designed to store at least one reference voltage threshold indicative of the absence of a failure condition of the OLED light source 8, for example a voltage Vint; and an electronic processing device 19, which determines the failure condition on the basis of the voltage VS and the reference voltage threshold Vint. A failure condition of the OLED source 8 indicates the presence of the dead area state in one or more OLED light emitting areas 6 and can be determined when the voltage VS does not meet a predefined condition with the voltage threshold Vint.

A failure condition of the OLED light source 8 indicating the presence of the dead area state in one or more OLED light emitting areas 6 can be determined when the voltage VS is lower than the voltage threshold Vint.

It is understood that the electronic device 12 can determine the presence of the dead area state in one or more OLED light emitting areas 6 by means of predefined diagnostic functions, rather than by means of a comparison/cross-check between the voltage VS and the reference voltage threshold Vint.

For example, according to a different embodiment, the electronic device 12 can be configured in such a way as to: make a number of voltage measurements VS(t) during the measurement time interval (toff), determine/construct the voltage curve during the measurement time interval toff on the basis of the measured voltages VS(t), determine the mean square error between the voltage curve measured during the measurement time interval toff and a reference voltage curve indicative of the voltage trend in a condition of absence of a dead area state in one or more OLED light emitting areas 6.

The electronic device 12 can be configured to determine the presence of a failure condition indicative of the dead area state in one or more OLED light emitting areas 6 on the basis of the mean square error, for example when the latter exceeds a predetermined error threshold.

According to a different embodiment, the electronic device 12 is configured in such a way as to: characterise (represent mathematically) the trend of the voltage VS(t) during the measurement time interval toff by means of an exponential function ys of the type $ys = as * e^{(-bsx)} + cs$; compare the coefficients as, bs, and cs which characterise the exponential function ys with respect to the predetermined coefficients a1, b1, and c1 of a reference exponential function $yr = a1 * e^{-b1x} + c1$ which characterises the trend of the voltage Vs in the absence of a failure condition indicative of a dead area state; and determine the presence of a dead area state in one or more OLED light emitting areas 6 on the basis of the result of the comparison between the coefficients as, bs, and cs and the coefficients a1, b1, and c1.

According to a different embodiment, the electronic device 12 can be configured in such a way as to: calculate, by means of an integration function/operation, a value indicative of the area under the curve of the variation of the voltage VS during the measurement time interval toff; compare the calculated value with a predetermined value and determine the presence of a failure condition indicative of a dead area state in one or more OLED light emitting areas 6 on the basis of the result of the comparison.

The Applicant has in fact found that in the presence of a failure condition indicative of a dead area state, the area subtended by the voltage curve VS during the measurement time interval toff is less than the area subtended by the voltage curve during the measurement time interval toff associated with a condition of absence of a failure condition indicative of a dead area state.

Figure 6:
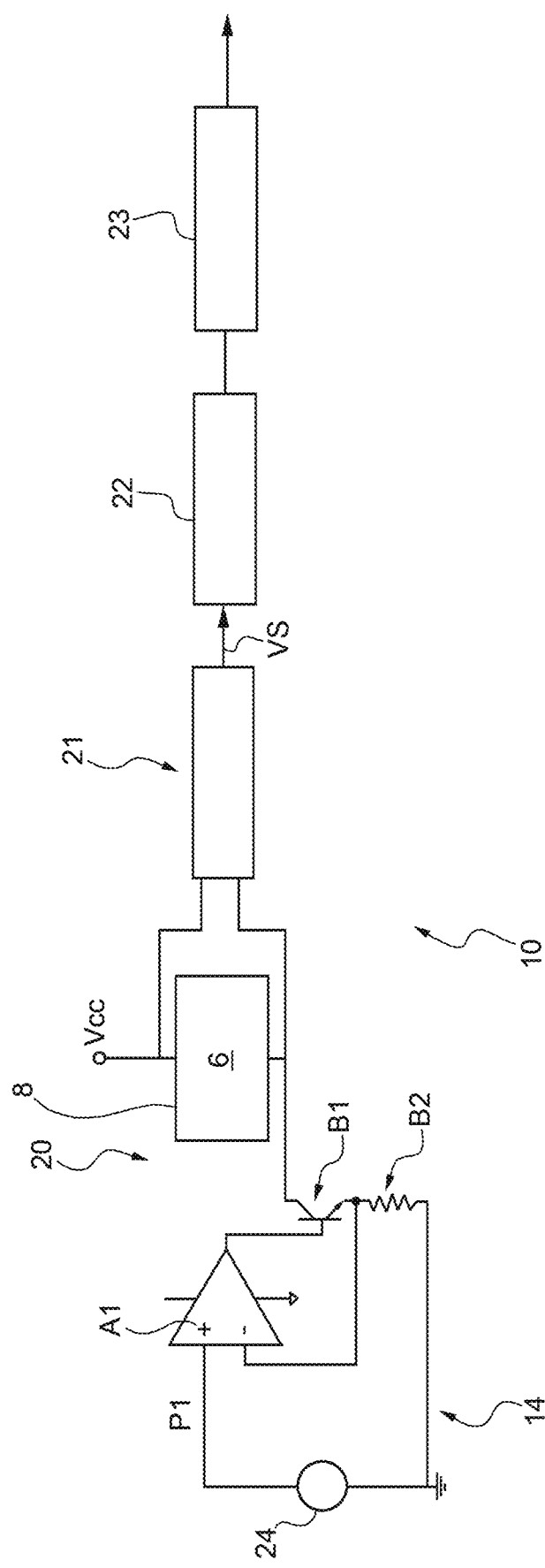
FIG. 6 is a circuit diagram for an example of an embodiment of the electronic device of the automobile lighting unit shown in FIG. 1.

FIG. 6 shows a possible embodiment of the electronic device 12, wherein the electronic control circuit 14 comprises a control stage 20, and the diagnostic circuit 10 comprises a subtraction stage 21, an integration stage 22, and a comparison stage 23.

The control stage 20 is designed to control the OLED light source 8 by means of the pilot signal P1 corresponding to a PWM signal. The control stage 20 may comprise: a control branch for the OLED light source 8 provided with an electronic switch, for example a transistor B1, and a resistor B2 connected in series between a first terminal of the OLED light source 8 and a terminal placed at a reference voltage, for example a ground voltage, a generator 24 which outputs the pilot signal P1 (PWM in voltage or current) characterised by pulses during the time intervals ton and absence of pulses during measurement time intervals toff, an operational amplifier A1 provided with a non-inverting terminal receiving the pilot signal P1, and an inverting terminal connected between the resistor B2 and the transistor B1, and an output terminal connected to the control terminal of the transistor.

The subtraction stage 21 of the diagnostic circuit 10 is connected between the first terminal of the OLED light source 8 and a second terminal of the OLED light source 8, which is in turn connected to a supply voltage Vcc. The subtraction stage 21 of the diagnostic circuit 10 is configured to supply the output voltage VS measured across the OLED light source 8 during the measurement time interval toff, in response to the pilot signal P1.

The integration stage 22 of the diagnostic circuit 10 is connected at the output of the subtraction stage 21 and is configured so as to receive the measured voltage VS and integrate it over the measurement time interval toff so as to determine and output a value indicative of the electrical behaviour of the OLED light source 8 during the measurement time interval toff.

The comparison stage 23 of the diagnostic circuit is connected with the output of the integration stage 22 to receive the value indicative of the electrical behaviour of the OLED light source 8 during the measurement time interval toff, and is configured in such a way as to compare this value with a predetermined threshold value, and to supply an output signal that is indicative of the presence or alternatively of the absence of a failure condition resulting from the presence or respectively absence of a dead area state in one or more OLED light emitting areas 6 of the OLED light source 8, on the basis of the outcome of the comparison.

For example, the comparison stage 23 may output a square wave signal indicative of the presence of a failure condition indicating a dead area state in one or more OLED light emitting areas 6 of the OLED light source 8, or a signal equal to zero indicating the absence of a failure condition, i.e. the absence of a dead area state.

Preferably, the pilot signal P1 of the PWM type can have a frequency between about 100 hertz and about 500 hertz. The Applicant has further found that a preferred frequency of the PWM pilot signal P1 could be about 200 hertz.

The Applicant has in fact found that the use of a PWM pilot signal P1 with the above frequency allows the diagnosis of a failure condition when the OLED light source is in the switched-on state without significantly altering the luminous state of the lighting unit to the eyes of an observer.

It is understood that the electronic device 12 described above could determine a failure condition of the OLED source 8 during any other operating phase of the lighting unit 1.

For example, according to a possible embodiment, the electronic device 12 described above could determine a failure condition of the OLED source during a step of switching off the OLED light source 8. In this case, the electronic diagnostic circuit 10 can determine the voltage VS on the basis of a trailing edge of the wave of the pilot signal P1 followed by the lighting unit then being switched off.

As described above, the electronic diagnostic circuit can therefore conveniently communicate information to the electronic control circuit 14 and/or the central control unit 100 indicative of a failure condition of the OLED light source 8 caused by the presence of a dead area state in at least one OLED light emitting area 6 of the OLED light source 8.

The electronic control circuit 14 and/or the central control unit 100 can be configured to carry out control operations on the basis of information provided by the electronic diagnostic circuit 10.

Control operations may comprise: switching off the OLED light source 8 when a failure condition of the OLED light source 8 is detected, and/or providing the user with information indicating a failure condition of the lighting unit (warning), and/or providing the user with information indicating a failure condition of the OLED light source 8 subjected to diagnosis.

The benefits of the lighting unit described above are as follows.

The method makes it possible to detect a failure condition of the OLED light source by means of a solution which is simple and therefore economical to implement.

Thanks to the detection of dead area states in the OLED light emitting areas, it is possible to determine, in a timely manner, significant photometric variations of the light emitted by the lighting unit which may not comply with regulations. In fact, in the presence of dead area states in the OLED light emitting areas, there is an increase in the current absorption of the lighting unit, which at the same time causes a significant reduction in light from the lighting unit.

Finally, it is clear that the automobile lighting unit, the electronic lighting device, and the operating method described above may be subject to modifications and variations without thereby departing from the scope of the present invention.

The invention claimed is:

1. An automobile lighting unit comprising a lighting device provided with one or more organic light emitting diode (OLED) light sources, said one or more OLED light sources comprising one or more light emitting areas each of which is associated to an organic light emitting diode (OLED) pixel or an organic light emitting diode (OLED)

segment, characterized in that the automobile lighting unit comprises electronic means configured to:
   control an OLED light source by means of a pilot signal (P1), which has a trailing edge (F2), wherein the pilot signal (P1) varies between a high value (Vmax) and a low value (Vmin),
   determine an electrical quantity (VS) indicative of the electrical behavior of said OLED light source during a measurement time interval (toff) subsequent to said trailing edge (F2) of said pilot signal (P1),
   determine a failure condition which is indicative of a dead area state in a light emitting area of said OLED light source on the basis of said electrical quantity (VS), and
   wherein the one or more light emitting areas of the OLED light source remain off and do not emit light only in said dead area state, even when the OLED light source is supplied with said pilot signal (P1).

2. The automobile lighting unit according to claim 1, wherein said pilot signal (P1) is a voltage signal comprising at least a square/rectangular waveform; said electrical quantity indicative of the electrical behavior of the OLED light source is the voltage (VS) of the OLED light source.

3. The automobile lighting unit according to claim 1, wherein:
   said pilot signal (P1) comprises a PWM signal,
   said measurement time interval (toff) following said trailing edge (F2) is the OFF time interval of said PWM signal,
   said electrical quantity comprises the voltage (VS) measured across said OLED light source during said OFF time interval (toff) of said PWM signal.

4. The automobile lighting unit according to claim 2, wherein said PWM pilot signal has a frequency between about 100 hertz and about 500 hertz.

5. The automobile lighting unit according to claim 1, wherein said electronic means comprise an electronic measuring device designed to measure the voltage (VS) of the OLED light source during said measurement time interval (toff), and an electronic processing device which determines a failure condition indicative of the presence of said dead area state, based on said voltage (VS) and a reference voltage threshold (Vint).

6. The automobile lighting unit according to claim 5, wherein a failure condition of the OLED source indicating the presence of the dead area state in one or more OLED light emitting areas is determined when said voltage (VS) does not meet a predefined condition with said voltage threshold (Vint).

7. The automobile lighting unit according to claim 6, wherein said failure condition of the OLED light source indicating the presence of the dead area state in one or more OLED light emitting areas is determined when said voltage (VS) is lower than the voltage threshold (Vint).

8. The automobile lighting unit according to claim 1, wherein said electronic means are configured to: perform a plurality of voltage measurements (VS(t)) during said measurement time interval (toff), determine/construct the voltage curve during said measurement time interval (toff) on the basis of the measured voltages (VS(t)), determine the mean square error between the voltage curve measured during the measurement time interval (toff) and a reference voltage curve indicative of the voltage trend in a condition of absence of the dead area state in one or more OLED light emitting areas, and determine the presence of a failure condition indicative of the dead area state in one or more OLED light emitting areas on the basis of the mean square error.

9. An operating method for an electronic lighting device comprised in a lighting unit provided with at least one organic light emitting diode (OLED) light source, said at least one OLED light source comprises one or more light emitting areas each of which is associated to an organic light emitting diode (OLED) pixel or an organic light emitting diode (OLED) segment, said method being characterized in that it comprises the steps of:
   controlling said OLED light source by means of a pilot signal (P1), which has a trailing edge (F2) wherein the pilot signal (P1) varies between a high value (Vmax) and a low value (Vmin),
   determining an electrical quantity (VS) indicative of the electrical behavior of said OLED light source during a measurement time interval (toff) subsequent to said trailing edge (F3) of said pilot signal (P1), and
   determining a failure condition which is indicative of a dead area state in a light emitting area of said OLED light source on the basis of said electrical quantity (VS),
   wherein the one or more light emitting areas of the OLED light source remain off and do not emit light only in said dead area state, even when the OLED light source is supplied with said pilot signal (P1).

10. The method according to claim 9, wherein said pilot signal (P1) is a voltage signal comprising at least a square/rectangular waveform; said electrical quantity indicative of the electrical behavior of the OLED light source is the voltage (VS) of the OLED light source.

11. A vehicle lighting device provided with one or more organic light emitting diode (OLED) light sources, said one or more OLED light sources comprising one or more light emitting areas each of which is associated to an organic light emitting diode (OLED) pixel or an organic light emitting diode (OLED) segment, characterized in that it comprises electronic means configured to:
   control an OLED light source by means of a pilot signal (P1) which has a trailing edge (F2) wherein the pilot signal (P1) varies between a high value (Vmax) and a low value (Vmin),
   determine an electrical quantity (VS) indicative of the electrical behavior of said OLED light source during a measurement time interval (toff) subsequent to said trailing edge (F2) of said pilot signal (P1), and
   determine a failure condition which is indicative of a dead area state in a light emitting area of said OLED light source based on said electrical quantity (VS),
   wherein the one or more light emitting areas of the OLED light source remain off and do not emit light only in said dead area state, even when the OLED light source is supplied with said pilot signal (P1).

12. The lighting device according to claim 11, wherein said pilot signal (P1) comprises a PWM signal,
   said measurement time interval (toff) following said trailing edge (F2) is the OFF interval of said PWM signal,
   said electrical quantity comprises the voltage (VS) measured across said OLED light source during said OFF time interval (toff) of said PWM signal.

* * * * *